United States Patent
Natzke et al.

(10) Patent No.: US 8,760,790 B2
(45) Date of Patent: Jun. 24, 2014

(54) ANALOG TUNNELING CURRENT SENSORS FOR USE WITH DISK DRIVE STORAGE DEVICES

(71) Applicant: LSI Corporation, Milpitas, CA (US)

(72) Inventors: Brad A. Natzke, Rochester, MN (US); Cameron C. Rabe, Mendota Heights, MN (US); Hong Jiang, Warren, NJ (US); Andrew P. Krebs, Eagan, MN (US); Jason P. Brenden, Mendota Heights, MN (US)

(73) Assignee: LSI Corporation, San Jose, CA (US)

(\*) Notice: Subject to any disclaimer, the term of this patent is extended or adjusted under 35 U.S.C. 154(b) by 45 days.

(21) Appl. No.: 13/674,308

(22) Filed: Nov. 12, 2012

(65) Prior Publication Data

US 2013/0235487 A1 Sep. 12, 2013

Related U.S. Application Data

(60) Provisional application No. 61/608,172, filed on Mar. 8, 2012.

(51) Int. Cl.
*G11B 5/02* (2006.01)

(52) U.S. Cl.
USPC ............. 360/67; 360/46; 360/66; 360/68; 360/75; 360/77.02

(58) Field of Classification Search
None
See application file for complete search history.

(56) References Cited

U.S. PATENT DOCUMENTS

| | | | | |
|---|---|---|---|---|
| 6,114,905 A * | 9/2000 | Hashimoto et al. | ........... | 330/252 |
| 6,211,736 B1 * | 4/2001 | Takeuchi et al. | ........... | 330/252 |
| 6,218,903 B1 * | 4/2001 | Hashimoto et al. | ........... | 330/277 |
| 6,462,600 B2 * | 10/2002 | Pakriswamy | ................. | 327/307 |
| 7,339,760 B2 * | 3/2008 | Gleason et al. | ................. | 360/67 |
| 7,504,814 B2 * | 3/2009 | Lee et al. | ...................... | 323/316 |
| 2006/0164053 A1 * | 7/2006 | Walter et al. | ................. | 323/282 |

\* cited by examiner

*Primary Examiner* — Dismery Mercedes
(74) *Attorney, Agent, or Firm* — Ryan, Mason & Lewis, LLP (57) ABSTRACT

Amplifier architectures are provided for current sensing applications. An amplifier includes a load device, an operational amplifier, a current source, and a bipolar transistor. The operational amplifier has a first input terminal connected to a first input node that receives an input current, and a second input terminal connected to a second input node that receives a reference voltage. The current source is connected to an output of the operational amplifier. The operational amplifier, the current source, and the bipolar transistor form a feedback loop that generates and maintains a bias voltage on the first input node based on the reference voltage applied to the second input node. The bipolar transistor amplifies the input current received on the first input node, and generates an amplified input current. The load device converts the amplified input current to an output voltage, wherein the output voltage is used to sense the input current.

34 Claims, 7 Drawing Sheets

ANALOG TUNNELING CURRENT SENSORS FOR USE WITH DISK DRIVE STORAGE DEVICES

CROSS-REFERENCE TO RELATED APPLICATION

This application claims priority to U.S. Provisional Application Ser. No. 61/608,172, filed on Mar. 8, 2012, which is incorporated herein by reference.

BACKGROUND

Disk-based storage devices such as hard disk drives are used to provide non-volatile data storage in a wide variety of different types of data processing systems. A typical hard disk drive comprises a spindle that holds one or more flat circular storage disks, also referred to as platters. Each storage disk comprises a substrate made from a non-magnetic material, such as aluminum or glass, which is coated with one or more thin layers of magnetic material. In operation, data is read from and written to tracks of the storage disk via a read/write head that is moved precisely across the disk surface by a positioning arm as the disk spins at high speed.

Hard disk drive devices implement tunneling current sensor circuitry to detect when the read/write head is positioned at a proper distance from the storage disk to perform a read or write operation. A sensor element, which is manufactured as part of the read/write head, operates as a transducer that generates a sensor current as the read/write head approaches the storage disk. The sensor current output from the sensor element is processed by the tunneling current sensor circuitry to determine when the read/write head is properly positioned at a predetermined gap distance from the surface of the storage disk to perform a read or write operation, based on a magnitude of the sensor current.

SUMMARY

In one embodiment of the invention, an amplifier circuit includes a first input node to receive an input current, a second input node to receive an input reference voltage, an output node, a first supply voltage node, and a second supply voltage node, a load device, an operational amplifier, a current source, and a bipolar transistor. The load device is connected between the output node and the first supply voltage node. The operational amplifier has a first input terminal connected to the first input node, a second input terminal connected to the second input node, and an output terminal. The current source is connected to the output terminal of the operational amplifier and to the second supply voltage node. The bipolar transistor has a base terminal connected to the first input node, a collector terminal connected to the output node, and an emitter terminal connected to the current source. The operational amplifier, the current source, and the bipolar transistor form a feedback loop that generates and maintains a bias voltage on the first input node based on the input reference voltage applied to the second input node. The bipolar transistor amplifies the input current that is input to the base terminal and generates a collector current as the amplified input current. The load device converts the collector current of the bipolar transistor to an output voltage on the output node.

Further embodiments of the invention will be described or become apparent from the following detailed description of embodiments, which is to be read in conjunction with the accompanying drawings.

DETAILED DESCRIPTION

Figure 1:
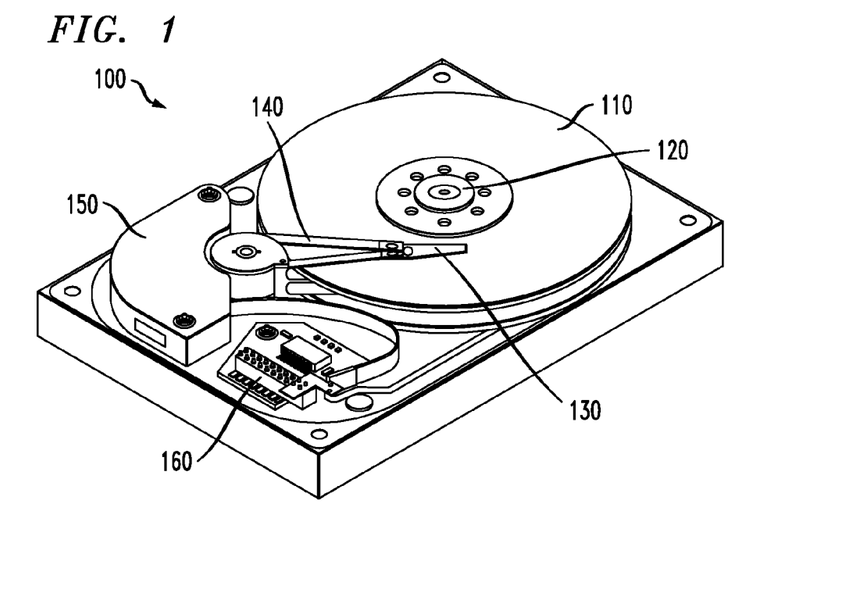
FIG. 1 shows a perspective view of a disk-based storage device according to an embodiment of the invention.

FIG. 1 shows a disk-based storage device 100 in accordance with an embodiment of the invention. The storage device 100 in this embodiment more specifically comprises a hard disk drive that includes a storage disk 110. The storage disk 110 has a storage surface coated with one or more magnetic materials that are capable of storing data bits in the form of respective groups of media grains oriented in a common magnetization direction (e.g., up or down). The storage disk 110 is connected to a spindle 120. The spindle 120 is driven by a spindle motor, not explicitly shown in the figure, in order to spin the storage disk 110 at high speed.

Data is read from and written to the storage disk 110 via a read/write head 130 that is mounted on a positioning arm 140. The position of the read/write head 130 adjacent, over as illustrated in FIG. 1, the magnetic surface of the storage disk 110 is controlled by an electromagnetic actuator 150. The electromagnetic actuator 150 and its associated driver circuitry can be viewed as comprising a portion of what is generally referred to herein as "control circuitry" of the storage device 100. The control circuitry is assumed to further include additional electronics components arranged on an opposite side of the assembly and therefore not visible in the perspective view of FIG. 1. The term "control circuitry" as used herein is therefore intended to be broadly construed so as to encompass, by way of example and without limitation, drive electronics, signal processing electronics, and associated processing and memory circuitry, and may encompass additional or alternative elements utilized to control positioning of the read/write head 130 relative to the storage surface of the storage disk 110 in the storage device 100. A connector 160 is used to connect the storage device 100 to a host computer or other related processing device.

FIG. 1 shows an embodiment of the invention with one instance of each of the single storage disk 110, read/write head 130, and positioning arm 140. In an alternate embodiment of the invention, the storage device 100 comprises multiple instances of one or more of these or other drive components. For example, in an alternative embodiment of the invention, the storage device 100 comprises multiple storage disks attached to the same spindle such that each disk rotates at the same speed, as well as multiple read/write heads and associated positioning arms coupled to one or more actuators.

A given read/write head as that term is broadly used herein may be implemented in the form of a combination of separate read and write heads. More particularly, the term "read/write" as used herein is intended to be construed broadly as read and/or write, such that a read/write head may comprise a read head only, a write head only, a single head used for both reading and writing, or a combination of separate read and write heads. Such heads may comprise, for example, write heads with wrap-around or side-shielded main poles, or any other types of heads suitable for recording and/or reading data on a storage disk.

In addition, the storage device 100 as illustrated in FIG. 1 may include other elements in addition to or in place of those specifically shown, including one or more elements of a type commonly found in conventional storage devices. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other storage device configurations may be used in implementing embodiments of the invention.

Figure 2:
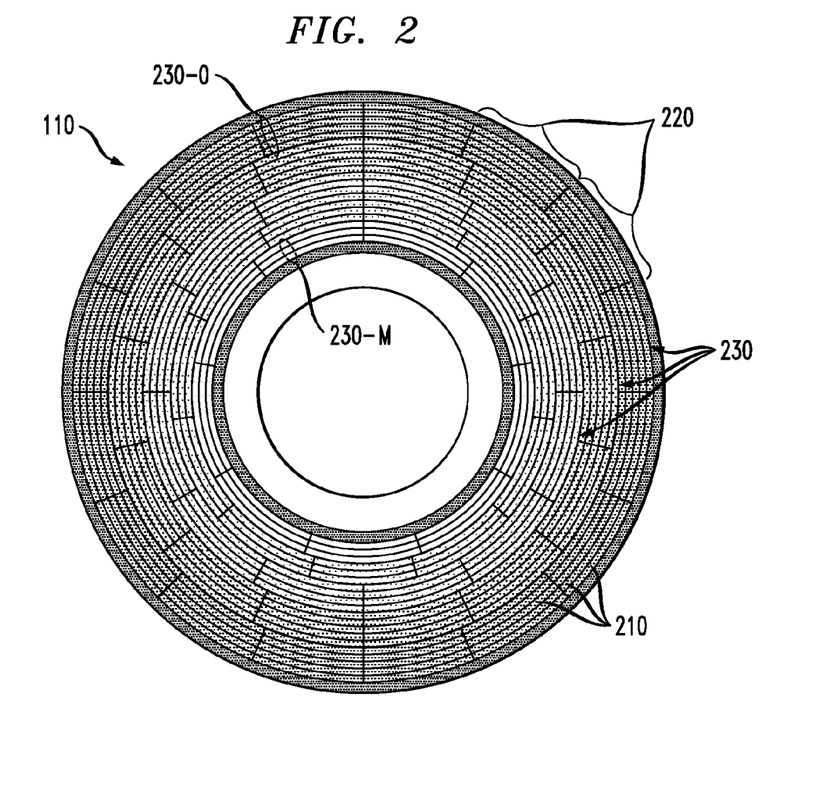
FIG. 2 shows a plan view of a storage disk in the storage device of FIG. 1.

FIG. 2 shows the storage surface of the storage disk 110 in greater detail. As illustrated, the storage surface of storage disk 110 comprises a plurality of concentric tracks 210. Each track is subdivided into a plurality of sectors 220 that are capable of storing a block of data for subsequent retrieval. The tracks located toward the outside edge of the storage disk have a larger circumference when compared to those located toward the center of the storage disk. The tracks are grouped into several annular zones 230, where the tracks within a given one of the zones have the same number of sectors. Those tracks in the outer zones have more sectors than those located in the inner zones. In this example, it is assumed that the storage disk 110 comprises M+1 zones, including an outermost zone 230-0 and an innermost zone 230-M.

The outer zones of the storage disk 110 provide a higher data transfer rate than the inner zones. This is in part due to the fact that the storage disk in the present embodiment, once accelerated to rotate at operational speed, spins at a constant angular or radial speed regardless of the positioning of the read/write head, but the tracks of the inner zones have smaller circumference than those of the outer zones. Thus, when the read/write head 130 is positioned over one of the tracks of an outer zone, it covers a greater linear distance along the disk surface for a given 360° turn of the storage disk than when it is positioned over one of the tracks of an inner zone. Such an arrangement is referred to as having constant angular velocity (CAV), since each 360° turn of the storage disk takes the same amount of time, although it should be understood that CAV operation is not a requirement of embodiments of the invention.

Data bit density is generally constant across the entire storage surface of the storage disk 110, which results in higher data transfer rates at the outer zones. Accordingly, the outermost annular zone 230-0 of the storage disk has a higher average data transfer rate than the innermost annular zone 230-M of the storage disk. The average data transfer rates may differ between the innermost and outermost annular zones in a given embodiment of the invention by more than a factor of two. For example, in one embodiment of the invention, the outermost annular zone may have a data transfer rate of approximately 2.3 Gigabits per second (Gb/s), while the innermost annular zone has a data transfer rate of approximately 1.0 Gb/s. In such an implementation, the hard disk drive may more particularly have a total storage capacity of 500 GB and a spindle speed of 7200 RPM, with the data transfer rates ranging, as noted above, from about 2.3 Gb/s for the outermost zone to about 1.0 Gb/s for the innermost zone.

The storage disk 110 may be assumed to include a timing pattern formed on its storage surface. Such a timing pattern may comprise one or more sets of servo address marks (SAMs) or other types of servo marks formed in particular sectors in a conventional manner SAMs may therefore be viewed as an example of what are more specifically referred to herein as servo marks. The particular data transfer rates and other features described above are presented for purposes of illustration only, and should not be construed as limiting in any way. A wide variety of other data transfer rates and storage disk configurations may be used in other embodiments.

Figure 3:
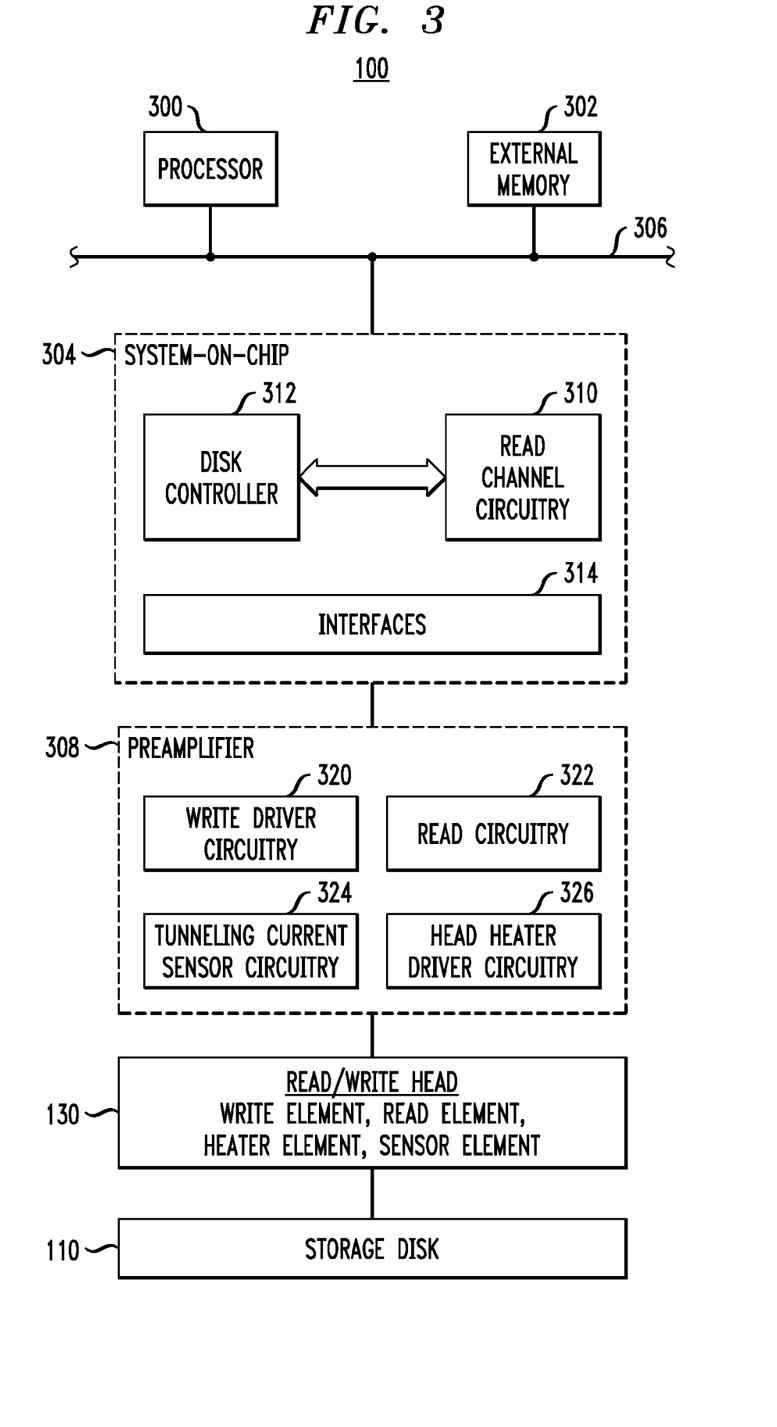
FIG. 3 is a block diagram of a portion of the storage device of FIG. 1 including a preamplifier that comprises tunneling current sensor circuitry according to an embodiment of the invention.

FIG. 3 shows a portion of the storage device 100 of FIG. 1 in greater detail. As shown in FIG. 3, the storage device 100 comprises a processor 300, a memory 302 and a system-on-a-chip (SOC) 304, which communicate over a bus 306. The storage device 100 further comprises a preamplifier 308 providing an interface between the SOC 304 and the read/write head 130. The memory 302 is an external memory relative to the SOC 304 and other components of the storage device 100, but is nonetheless internal to the storage device 100. The SOC 304 includes read channel circuitry 310, a disk controller 312, and interfaces 314, wherein the SOC 304 directs the operation of the read/write head 130 in reading data from and writing data to the storage disk 110. The interfaces 314 communicate with the circuitry 320, 322, 324 and 326 in the preamplifier 308. The interfaces 314 may be viewed as examples of what are more generally referred to herein as "interface circuitry." The interfaces 314 may include, for example, one or more write interfaces over which write signals are provided to the preamplifier 308 from the SOC 304, and one or more read interfaces over which read signals are provided to the SOC 304 from the preamplifier 308. It is to be appreciated, however, that the disclosed techniques are not limited to such write and read interfaces, and may be adapted for use with a wide variety of other types of interfaces.

The bus 306 may comprise, for example, one or more interconnect fabrics. Such fabrics may be implemented in the present embodiment as Advanced eXtensible Interface (AXI) fabrics, described in greater detail in, for example, the Advanced Microcontroller Bus Architecture (AMBA) AXI v2.0 Specification, which is incorporated by reference herein. The bus may also be used to support communications between other system components, such as between the SOC 304 and the preamplifier 308. It should be understood that AXI interconnects are not required, and that a wide variety of other types of bus configurations may be used in embodiments of the invention.

The processor 300, memory 302, SOC 304 and preamplifier 308 may be viewed as collectively comprising one possible example of "control circuitry" as that term is utilized herein. Numerous alternative arrangements of control circuitry may be used in other embodiments of the invention, and such arrangements may include a subset of the components 300, 302, 304 and 308, or portions of one or more of these components. For example, the SOC 304 itself may be viewed as an example of "control circuitry." The control circuitry of the storage device 100 as shown in FIG. 3 is generally configured to process data received from and supplied to the read/write head 130 and to control positioning of the read/write head 130 relative to the storage disk 110. Certain operations of the SOC 304 in the storage device 100 of FIG. 3 may be directed by processor 300, which executes code stored in external memory 302. Thus, at least a portion of the control functionality of the storage device 100 may be implemented at least in part in the form of software code.

The external memory 302 may comprise electronic memory such as random access memory (RAM) or read-only memory (ROM), in any combination. In the present embodiment, it is assumed without limitation that the external memory 302 is implemented at least in part as a double data rate (DDR) synchronous dynamic RAM (SDRAM), although a wide variety of other types of memory may be used in other embodiments. The memory 302 is an example of what is more generally referred to herein as a "computer-readable storage medium." Such a medium may also be writable.

Although the SOC 304 in the present embodiment is assumed to be implemented on a single integrated circuit, that integrated circuit may further comprise portions of the processor 300, memory 302, bus 306 and preamplifier 308. Alternatively, portions of the processor 300, memory 302, bus 306 and preamplifier 308 may be implemented at least in part in the form of one or more additional integrated circuits, such as otherwise conventional integrated circuits designed for use in a hard disk drive and suitably modified to implement tunneling current sensor circuitry as described herein. Other types of integrated circuits that may be used to implement processor, memory or other storage device components of a given embodiment include, for example, a microprocessor, digital signal processor (DSP), application-specific integrated circuit (ASIC), field-programmable gate array (FPGA) or other integrated circuit device.

Although shown as part of the storage device 100, in an alternate embodiment of the invention, one or both of the processor 300 and memory 302 are implemented at least in part within an associated processing device, such as a host computer or server in which the storage device is installed. Accordingly, elements 300 and 302 in FIG. 3 may be viewed as being separate from the storage device 100, or as representing composite elements each including separate processing or memory circuitry components from both the storage device and its associated processing device. As noted above, at least portions of the processor 300 and memory 302 may be viewed as comprising "control circuitry" as that term is broadly defined herein.

As further depicted in FIG. 3, the preamplifier 308 comprises write driver circuitry 320, read circuitry 322, tunneling current sensor circuitry 324, and head heater driver circuitry 326. The read/write head 130 comprises various components such as a write element, read element, heater element and sensor element. The write driver circuitry 320 provides write signals to the read/write head 130 to write data to the storage disk 110 using the write element(s) of the head 130. The write signals are generally characterized as current signals, but may alternatively be characterized as voltage signals. Data bits are usually each stored as group of media grains oriented in a common magnetization direction (e.g., up or down). In order to record a given data bit, the write driver circuitry 320 generates a write signal that transitions from a negative write current to a positive write current, or vice-versa, where the magnitude of the write current from zero to its peak value may be in the range of about 15 to 65 milliamperes (mA), although different values can be used. The term "write driver circuitry" is intended to encompass any type of driver circuitry that may be used to generate one or more write signals.

The read element of the read/write head 130 is used to read data from the storage disk 110 in conjunction with the read circuitry 322 of the preamplifier 308. The read circuitry 322 transforms signal waveforms read back from the storage disk 110 into data for delivery to the computer.

The head heater driver circuitry 326 comprises a power amplifier and other support circuitry that is programmed to generate and regulate either a programmed voltage or power to the heater element (e.g., resistive element and pads) in the read/write head 130, which causes the tip of the head 130 (that contains the read/write elements) to move closer to the surface of the storage disk 110 via a heater actuation process. As the read/write head 130 approaches the surface of the storage disk 110, a sensor current is generated in the sensor element (e.g., metallic needle). The sensor current increases as the sensor element approaches the surface of the storage disk 110.

The sensor current is input to, and processed by, the tunneling current sensor circuitry 324 to detect when the read/write head 130 is positioned at some predefined distance (gap) from the surface of the storage disk 110, which is deemed sufficient to properly perform a read or write operation, based on a magnitude of the sensor current. The heater actuation process nudges the read/write head 130 closer to the surface of the storage disk 110 until the magnitude of the sensor current reaches a predefined (programmed) reference level. When the sensor current is determined to have reached the predefined reference level, the tunneling current sensor circuitry 324 generates a control signal indicating a "detection event." The term "detection event" as used herein refers to an occurrence of when the read/write head 130 is determined to be positioned at a predefined (gap) distance from the surface of the storage disk to perform a read or write operation. The "detection event" control signal causes the head heater driver circuitry 326 to control the heater actuation process so that the read/write head 130 stops moving toward the surface of the storage disk.

In general, the amount of sensor current generated by the sensor element is a sum of multiple currents generated by different current sources. For instance, the sensor current includes a "tunneling current" that is generated by the sensor element as a function of a bias voltage (applied to the sensor element) and a gap distance between the sensor element (e.g., needle) and the surface of the storage disk 110. In particular, the tunneling current $I_t$ can be determined as follows: $I_t = K * V_{bias} * e^{(k*d)}$, where K and k are constants, $V_{bias}$ is a bias voltage on the sensor element, and where d is the distance between the sensor element and the surface of the storage disk 110. The tunneling current increases exponentially as the read/write head 130 approaches the disk. Other sources of the sensor current include static electricity, for example.

Typically, disk drive manufacturers will select a predefined gap distance as the smallest gap between head tip and the storage media without touching. For a given design, the magnitude of the sensor current that is generated (from all sources) at that target gap distance is deemed to be the reference sensor current level that would be indicative of a detection event, for purposes of implementing tunneling current sensor circuitry 324 as generically illustrated in FIG. 3. Various embodiments of the tunneling current sensor circuitry 324 of FIG. 3 will now be discussed in further detail with reference to FIGS. 4, 5, 6 and 7.

Figure 4:
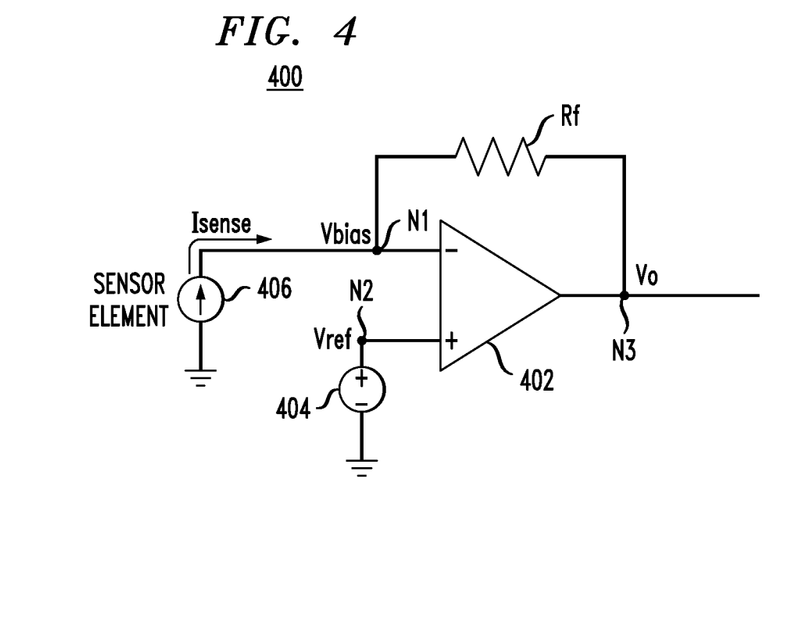
FIG. 4 schematically illustrates a tunneling current sensor circuit according to an embodiment of the invention.

FIG. 4 schematically illustrates a tunneling current sensor circuit according to an embodiment of the invention. In particular, FIG. 4 illustrates an amplifier 400 of a tunneling current sensor circuit, which comprises an operational amplifier 402, a reference voltage source 404, a sensor element 406, and a feedback resistor Rf. The operational amplifier 402 has an inverting ("−") input connected to a first node N1, a non-inverting ("+") input connected to a second node N2, and an output connected to third node N3 (output node). The reference voltage source 404 is connected to the second node N2 to apply a reference voltage $V_{ref}$ to the non-inverting ("+") input of the operational amplifier 402. The sensor element 406 is connected to the first node N1. The feedback resistor Rf is connected between third node N3 (output node) and the first node N1.

The amplifier 400 shown in FIG. 4 comprises an inverting transimpedance amplifier architecture, which outputs a voltage Vo (on node N3) that is proportional to a sensor current $I_{sense}$ that is output from the sensor element 406. In particular, the sensor current $I_{sense}$ output from the sensor element 406 is amplified through the feedback resistor Rf and the output voltage Vo is computed as $Vo=(I_{sense}*R^f)+V_{ref}$. The bias voltage $V_{bias}$ on the first node N1 is set by the reference voltage $V_{ref}$. The sensor current $I_{sense}$ output from the sensor element 406 is a function of the bias voltage $V_{bias}$ and the gap distance between the sensor element 406 and a surface of the storage medium disk plate. In one embodiment of the invention, the reference voltage source 404 is a programmable voltage source that can be programmed to generate a desired reference voltage $V_{ref}$ which is used to set the bias voltage $V_{bias}$. As noted above, in a storage device application, the sensor current $I_{sense}$ output from the sensor element 406 includes a combination of primarily tunneling current, as well as other small currents from other sources.

Furthermore, the amplifier 400 operates to reflect the reference voltage $V_{ref}$ at node N2 onto the first node N1 to create the bias voltage $V_{bias}$, which is stabilized by the feedback loop. In particular, the feedback loop maintains the bias voltage $V_{bias}$ constant regardless of the sensor current $I_{sense}$. The amplifier 400 virtually shorts $V_{ref}$ and $V_{bias}$ which allows the sensor element 406 to be biased on the $V_{bias}$ level without introducing any noise current to the current sensor circuit. The output voltage $V_o$ increases as the sensor current increases $I_{sense}$ and the output voltage $V_o$ decreases as the sensor current $I_{sense}$ decreases. As the output voltage $V_o$ on node N3 changes, however, the bias voltage remains substantially constant.

The amplifier 400 of FIG. 4 allows flexibility in setting and stabilizing the bias voltage $V_{bias}$ in both a negative and positive direction via the programmable reference voltage $V_{ref}$ and the feedback loop. However, in some applications where a relatively small sensor current $I_{sense}$ is generated, a relatively large feedback resistor Rf is needed for a more optimal circuit performance, which resistor may be too large for practical purposes. Moreover, a large offset voltage of the operational amplifier 402 can be difficult to tune out, and thereby degrading overall performance.

Figure 5:
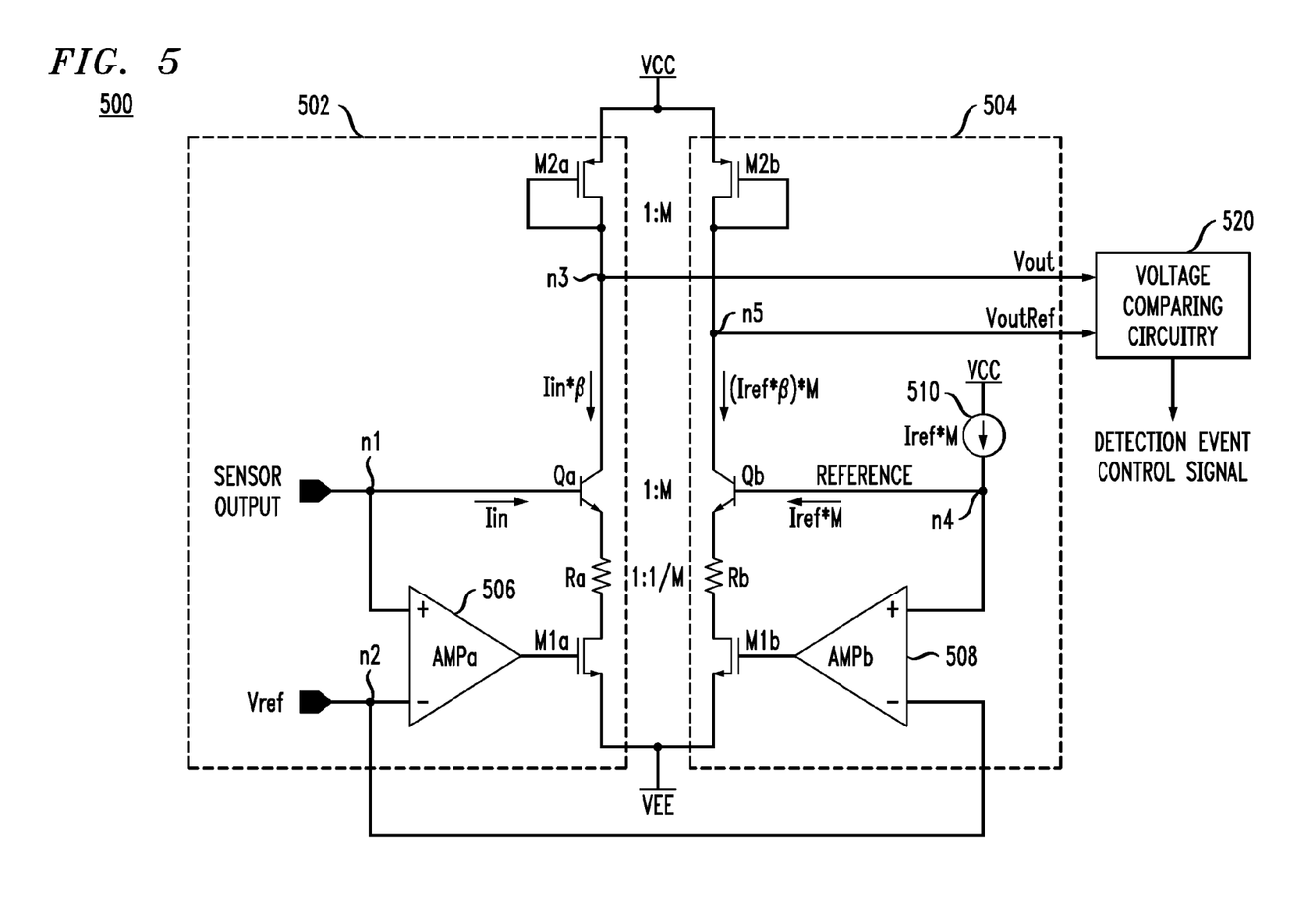
FIG. 5 schematically illustrates a tunneling current sensor circuit according to another embodiment of the invention.

FIG. 5 schematically illustrates a tunneling current sensor circuit according to another embodiment of the invention. In particular, FIG. 5 illustrates a tunneling current sensor circuit 500 comprising an input amplifier stage 502, a reference circuit 504, and voltage comparing circuitry 520. In general, the input amplifier stage 502 comprises an operational amplifier 506, a MOS transistor M1a, a resistor Ra, a bipolar transistor Qa, and a MOS transistor M2a. The reference circuit 504 comprises an operational amplifier 508, a MOS transistor M1b, a resistor Rb, a bipolar transistor Qb, a MOS transistor M2b, and a programmable reference current source 510.

More specifically, the input amplifier stage 502 comprises a first input node n1, a second input node n2, and an output node n3. The first input node n1 is connected to a sensor element (not shown) and the second input node n2 is connected to a reference voltage source Vref. The operational amplifier 506 comprises a non-inverting "+" terminal connected to the first input node n1 and an inverting terminal "−" connected to the second input node n2. The MOS transistor M2a is a PFET device which is connected in a diode configuration. The diode-connected MOS transistor M2a is connected between a first power supply node VCC and the output node n3. The bipolar transistor Qa is an NPN device having a base terminal connected to the first input node n1, a collector terminal connected to the output node n3, and an emitter terminal connected to the resistor Ra. The MOS transistor M1a has a gate terminal connected to an output of the operational amplifier 506, a drain terminal connected to the resistor Ra, and a source terminal connected to a second voltage supply node VEE.

Furthermore, the reference circuit 504 comprises a reference node n4 and an output node n5. The programmable reference current source 510 is connected between the first voltage supply node VCC and the reference node n4. The operational amplifier 508 comprises a non-inverting "+" terminal connected to the reference node n4, and an inverting terminal "−" connected to the second input node n2. The MOS transistor M2b is a PFET device which is connected in a diode configuration. The diode-connected MOS transistor M2b is connected between the first power supply node VCC and the output node n5. The bipolar transistor Qb is an NPN device having a base terminal connected to the reference node n4, a collector terminal connected to the output node n5, and an emitter terminal connected to the resistor Rb. The MOS transistor M1b has a gate terminal connected to an output of the operational amplifier 508, a drain terminal connected to the resistor Rb, and a source terminal connected to the second voltage supply node VEE.

The input amplifier stage 502 comprises a single-ended amplifier configuration where the input bipolar transistor Qa serves as a common-emitter amplifier that amplifies the input sensor current $I_{in}$ using "beta" ($\beta$) multiplication to generate a collector current equal to approximately $I_{in}*\beta$, and where the diode-connected MOS transistor M2a provides a diode load to generate an output voltage Vout on the output node n3. The operational amplifier 506, the MOS transistor M1a, and the bipolar transistor Qa form a feedback loop that reflects the reference voltage Vref onto the input node n1 as a bias voltage that is applied to the base terminal of bipolar transistor Qa and to the sensor element connected to the input node n1. The sensor current output from the sensor element is a function of the bias voltage on the input node n1 and the gap distance between the sensor element and the surface of a storage disk. In one embodiment of the invention, the reference voltage Vref is generated by a programmable voltage source to generate a desired reference voltage Vref which is used to set the bias voltage on the input node n1.

Similarly, the reference circuit 504 comprises a single-ended amplifier configuration having components M2b, Qb, Rb, M1b, AMPb 508, which are matched and scaled by a factor of M to respective components M2a, Qa, Ra, M1a, AMPa 506 of the input amplifier stage 502. In particular, the reference circuit 504 comprises a single-ended amplifier configuration where the input bipolar transistor Qb serves as a common-emitter amplifier that amplifies a reference current $I_{ref}*M$ using "beta" ($\beta$) multiplication to generate a collector current equal to approximately $(I_{ref}*\beta)*M$, and where the diode-connected MOS transistor M2b provides a diode load to generate a output reference voltage VoutRef on the output node n5. The operational amplifier 508, the MOS transistor M1b, and the bipolar transistor Qb form a feedback loop that reflects the reference voltage Vref onto the reference node n4 as a bias voltage that is applied to the base terminal of bipolar transistor Qb. The reference current $I_{ref}*M$ (which is input to the base of bipolar transistor Qb) is a programmable current that is generated by the programmable current source 510.

In the embodiment of FIG. 5, a M-scaling and circuit matching techniques are employed to generate a large reference current $I_{ref}*M$ in the reference circuit 504, which can be effectively matched to a relatively much smaller sense current $I_{in}$ in the signal path of the input amplifier stage 502. The current $I_{ref}$ is a reference sensor current level that represents a magnitude of the sensor current $I_{in}$ that would be indicate of a "detection event" (i.e., $I_{ref}$ is the magnitude of the sensor current $I_{in}$ that would be output from the sensor element when the read/write head is positioned at a predefined (gap) distance from the surface of the storage disk to perform a read or write operation).

In one embodiment of the invention, the reference sensor current level $I_{ref}$ has a magnitude in a range of about 12.5 pA to about 1.5 nA. As it is difficult to generate such small currents using current sources, the programmable current source 510 is configured to generate a reference current that is a M-scaled version of the reference sensor current level $I_{ref}$, the various matched components of the reference circuit 504 are scaled by the same M factor so that the tunneling current sensor circuitry 500 can detect small sensor currents with high sensitivity by comparing the output voltages generated by the circuits 502 and 504 at nodes n3 and n5.

For example, in the embodiment of FIG. 5, when the input sensor current $I_{in}$ is equal to the non-scaled reference sensor current level $I_{ref}$, the output voltages Vout and VoutRef on output nodes n3 and n5 will be equal. The output voltages on nodes n3 and n5 are input to the voltage comparing circuitry 520 to determine when Vout=VoutRef, and generate an output control signal to indicate a detection event when Vout=VoutRef. The voltage comparing circuitry 520 can be implemented using any conventional or state of the art architecture, including, e.g., filters, level-shifters, comparators, etc., to compare the output voltages Vout and VoutRef.

The output voltage Vout on the output node n3 is computed as:

$$V_{out} = \sqrt{\left[(I_{in}*\beta)*\frac{2}{k'}*\frac{L}{W}\right]} + V_t,$$

where $\beta$ is the amplification factor for bipolar transistor Qa, k' is a constant that indicates a drive (current) strength of the MOS transistor M2a, L and W represent the channel length and channel width of MOS transistor M2a, and where $V_t$ represents a threshold voltage of MOS transistor M2a.

The output reference voltage VoutRef on the output node n5 is computed as:

$$V_{outRef} = \sqrt{\left[(I_{ref}*\beta)*M*\frac{2}{k'}*\frac{L}{(W*M)}\right]} + V_t,$$

where $\beta$ is the amplification factor for bipolar transistor Qb, k' is a constant that indicates a drive (current) strength of the MOS transistor M2b, L and W represent the channel length and channel width of MOS transistor M2b, where $V_t$ represents a threshold voltage of MOS transistor M2b, and where M is the scaling factor in the device ratio between MOS transistors M2a and M2b.

As can be seen from the above equations for Vout and VoutRef, the output voltages on nodes n3 and n5 are a function of the device parameters of bipolar transistors Qa and Qb and MOs transistors M2a and M2b, and not the device parameters for resistors Ra and Rb and MOS transistors M1a and M1b. In one embodiment of the invention, the value of M can be in a range from about 10 to about 30 depending on how well matched the devices are for a given fabrication process. For instance, in one embodiment, the value of M is 24.

The bipolar transistors Qa and Qb are matched to have the same beta amplification factor. In the embodiment of FIG. 5, the bipolar transistors Qa and Qb are shown as NPN transistors. In an alternate embodiment of the invention, the bipolar transistors Qa and Qb can be PNP transistors. With a PNP configuration, other straightforward modifications and variations of the disclosed embodiments would include changing NMOS transistors to PMOS types, and vice versa.

The MOS transistors M2a and M2b in their diode-connected configurations serve as current-to-voltage converter devices that provide high gain and sensitivity for small currents. In one embodiment of the invention, the MOS transistors M1b and M1a are scaled in size such that the ratio $[(W/L)_b]/[(W/L)_a]=M$ to match the expected currents in bipolar transistors Qa and Qb. For example, the width W of the MOS transistor M2b in the reference circuit 504 is made larger so that the channel resistance of MOS transistor M2b is smaller by a factor of M than the channel resistance of MOS transistor M2a. In an alternate embodiment of the invention, this matching is not implemented due to feedback compensation provided by the circuit. Moreover, while the embodiment of FIG. 5 implements diode-connected PFETs for the MOS transistors M2a and M2b, in other embodiments of the invention, current-to-voltage conversion can be realized using other devices and techniques, including resistors, NPN diodes, current mirrors, etc. In an alternate embodiment of the invention where the bipolar transistors Qa and Qb are implemented as PNP devices, the MOS devices M2a and M2a would be implemented as NMOS devices.

In the embodiment of FIG. 5, the MOS transistors M1a and M1b function as current sources that are controlled by respective operational amplifiers 506 and 508. In this configuration, the bias voltage on node n1 is set by the feedback loop of the operational amplifier 506 driving a current source (M1a) to allow the proper emitter current to flow from Qa (in view of the base and collector currents of Qa) and generate an emitter voltage on Qa, for setting the bias voltage on n1 based on the reference voltage Vref. In this regard, the configuration of the amplifier circuit 502 provides a high-sensitivity, high-gain current amplifier, which enable detection of small input sensor currents with high sensitivity.

In one embodiment of the invention, it is desirable for the MOS transistors M1a and M1b to be matched so that their impact on the power supply is the same in both the signal and reference paths. In the embodiment of FIG. 5, the MOS transistors M1a and M1b are shown as NMOS devices. In other embodiments of the invention, the MOS transistors M1a and M1b can be implementing using other current source architectures such as cascade or source degenerated current source architectures. In an alternative embodiment of the invention, the bipolar NPN transistors are implemented in place of the NMOS transistor devices M1a and M1b. Moreover, in another alternate embodiment where the bipolar transistors Qa and Qb are implemented as PNP devices, the MOS devices M1a and M1a would be implemented as PMOS devices.

Furthermore, the resistors Ra and Rb are implemented in FIG. 5 to limit a maximum current through the respective current paths occupied by the resistors Ra and Rb. Depending on the implementation, the resistors Ra and Rb may or may not be necessary, and excluding these resistors does not change the application. For instance, if the reference voltage Vref is at a most negative level, and the sensor needle connected to node n1 is grounded, a short circuit will be generated, thereby generating a large base current at the input of the bipolar transistors Qa, which can damage the sensor element. In this regard, the resistors Ra and Rb limit the amount of current. In an alternate embodiment of the invention, the resistors Ra and Rb can be connected to the base terminal of bipolar transistors Qa and Qb to limit the amount of base current. However, placing a resistor device between the input node n1 and the base terminal of transistor Qa, for example, could result in leakage current at the input pin, which degrades sensitivity and performance of the current sensor circuitry.

Figure 6:
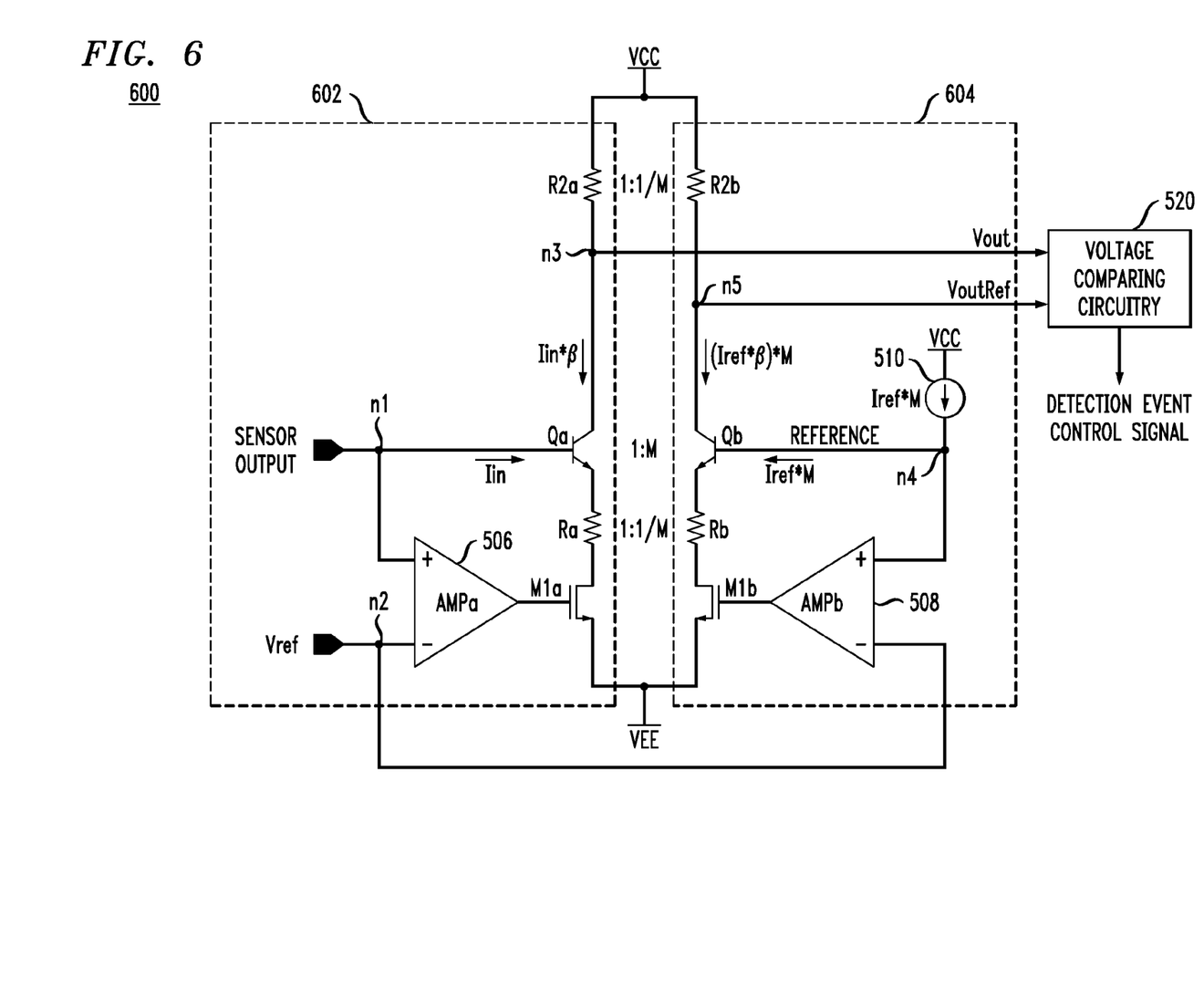
FIG. 6 schematically illustrates a tunneling current sensor circuit according to yet another embodiment of the invention.

FIG. 6 schematically illustrates a tunneling current sensor circuit according to another embodiment of the invention. In particular, FIG. 6 illustrates a tunneling current sensor circuit 500 comprising an input amplifier stage 602, a reference circuit 604, and voltage comparing circuitry 520. The input amplifier stage 602 and the reference circuit 604 are similar in structure and function as the input amplifier stage 502 and reference circuit 604 of FIG. 5, except that the input amplifier stage 602 and reference circuit 604 include load resistors R2a and R2b in place of the diode-connected MOS transistors M2a and M2b shown in FIG. 5, which are used as load devices for current-to-voltage conversion and generating output voltages on node n3 and n5 based on the collector currents generated by Qa and Qb. The ratio of the resistance values of the resistor R2a to the resistor R2b is 1:1/M.

The output voltage Vout on the output node n3 is computed as:

$$V_{out} = *(I_{in} * \beta) * R,$$

where β is the amplification factor for bipolar transistor Qa, and R is the resistance of R1a. The output reference voltage VoutRef on the output node n5 is computed as:

$$V_{outRef} = (I_{ref} * \beta) * M * \left(\frac{R}{M}\right),$$

where β is the amplification factor for bipolar transistor Qb, and R/M is the resistance value of R2b.

Similar to the embodiment of FIG. 5, in the embodiment of FIG. 6. when the input sensor current $I_{in}$ is equal to the non-scaled reference sensor current level $I_{ref}$, the output voltages Vout and VoutRef on output nodes n3 and n5 will be equal. The output voltages on nodes n3 and n5 are input to the voltage comparing circuitry 520 to determine when Vout=VoutRef, and generate an output control signal to indicate a detection event when Vout=VoutRef. The voltage comparing circuitry 520 can be implemented using any conventional or state of the art architecture, including, e.g., filters, level-shifters, comparators, etc., to compare the output voltages Vout and VoutRef.

In the embodiment of FIG. 6, the load resistors R2a and R2b are alternative devices that can be used as load devices for current-to-voltage conversion in applications where, for example, larger sense currents are employed. For applications with smaller sensor currents, the sensitivity can be diminished when using relatively small resistors because the voltage across the load resistors R2a and R2b can go to 0V. Thus, for smaller sense current applications, the load resistors R2a and R2b can be relatively large to increase sensitivity. In short, the size of the load resistors R2a and R2b can vary depending on how much sense current is required and how good the fabrication process is for fabricating matched devices, etc.

In general, the combination of M2a and M2b with a conventional voltage comparator can be considered a current comparator. Moreover, the combination of R2a and R2b and a conventional voltage comparator can be considered a current comparator. In the embodiments of FIGS. 5 and 6, a conventional current comparator can be used in place of the load devices and voltage comparator to directly compare the collector currents. This is possible for embodiments that use M=1 where the collector currents are of equivalent magnitude. For embodiments that use a larger factor of M, a specialized comparator can be used which scales one of the inputs according to the 1:M ratio, as implemented in FIGS. 5 and 6.

In the embodiments discussed above with regard to FIGS. 5 and 6, bipolar transistors are used to amplify small input currents (e.g., small sensor currents) to current levels that can be applied across load devices to obtain measurable output voltages (at nodes n3 and n5) with sufficient sensitivity. This is to be contrasted with the embodiment shown in FIG. 4 wherein the current amplification is implemented using an operational amplifier and feedback resistor Rf to amplify the input (Isense) current. The embodiment of FIG. 4 may require more input current than what is available at the input node N1 to make the bias voltage stable on the input node N1. As such, any offset in leakage currents in the operational amplifier 402 or in the feedback path, can cause the input to be "swamped out," thereby degrading performance. In the embodiments of FIGS. 5 and 6, bipolar transistors Qa and Qb are used to amplify the input currents without using feedback loops, thereby providing improved performance.

Moreover, with the embodiments discussed above with regard to FIGS. 5 and 6, any systematic variation in the bipolar transistor devices is removed from the gain equation, as the gain is a function of the ratios of various device sizes. When comparing the signal level to the threshold level, the threshold current is injected through a matching amplifier chain and is affected in the same way by process, temperature and voltage fluctuations.

The beta parameter of the bipolar transistor devices does contribute to a large portion of the gain. The architecture of FIGS. 5 and 6 uses this factor in conjunction with additional gain obtained from other sources, such as current mirrors with larger current mirror ratios. Furthermore, the use of small input sense currents results in relatively little current flow through the bipolar transistor Qa. As a result, the circuit may be slow to respond as the bandwidth of NPN transistors drops with decreasing current. The feedback loop formed by the amplifier 506, M1a, Ra, and Qa has the ability to drive the input voltage more negative. Any disturbance that causes the input voltage to decrease below Vref will rely on leakage paths or signal current to restore the input voltage back to Vref. As such, in other embodiments, a circuit can be added to pull the input voltage high again, but any such circuit will add leakage, degrading the high-sensitivity nature of the circuit.

Figure 7:
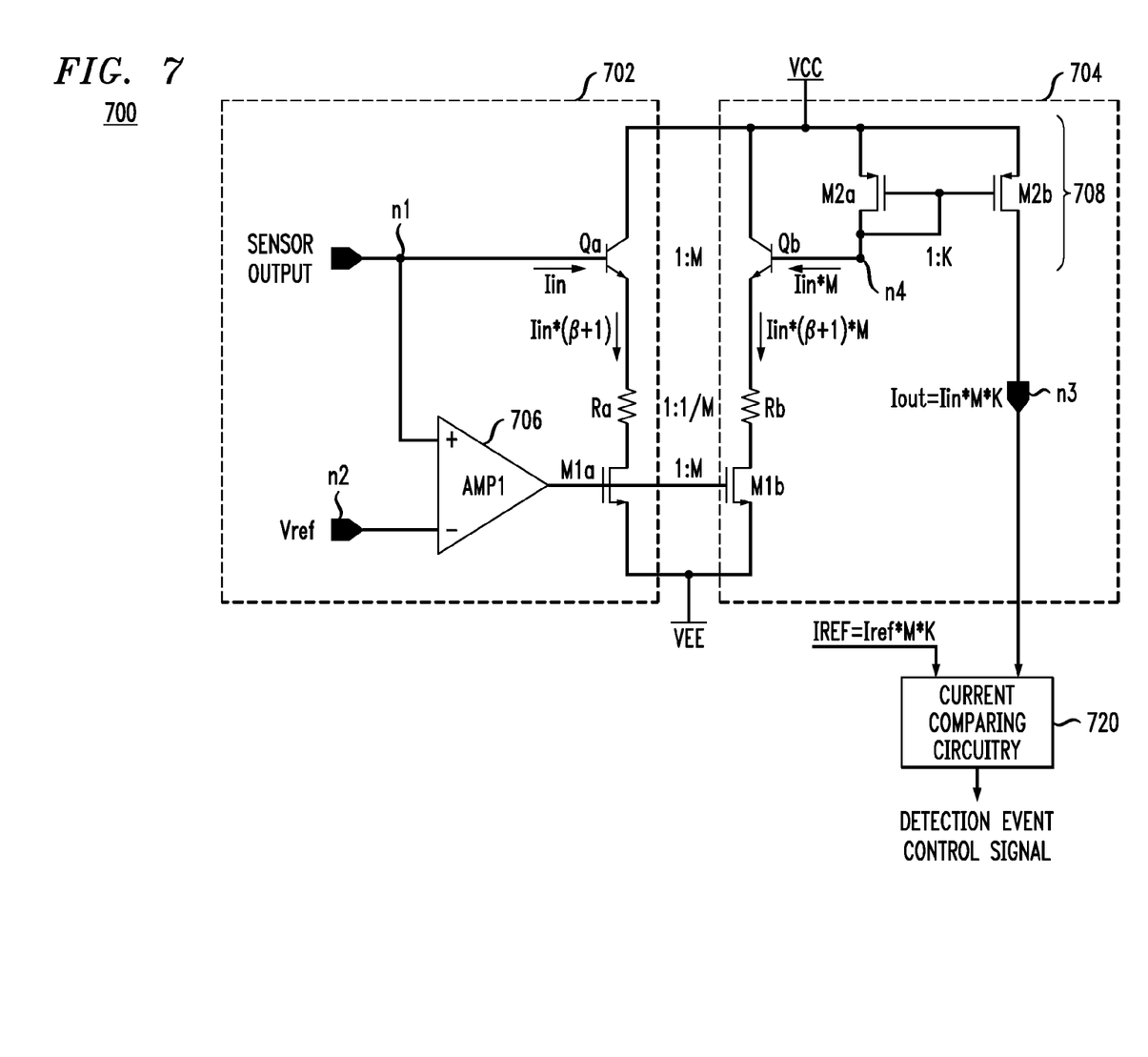
FIG. 7 schematically illustrates a tunneling current sensor circuit according to another embodiment of the invention.

FIG. 7 schematically illustrates a tunneling current sensor circuit according to another embodiment of the invention. In particular, FIG. 7 illustrates a tunneling current sensor circuit 700 comprising a first amplifier circuit 702, a second amplifier circuit 704, and current comparing circuitry 720. In general, the first amplifier 702 comprises an operational amplifier 706, a MOS transistor M1a, a resistor Ra, and a bipolar transistor Qa. The second amplifier circuit 704 comprises a MOS transistor M1b, a resistor Rb, a bipolar transistor Qb, and a current mirror circuit 708 comprising MOS transistors M2a and M2b.

More specifically, the first amplifier circuit 702 comprises a first input node n1 and a second input node n2. The first input node n1 is connected to an output of a sensor element (not shown) and the second input node n2 is connected to a reference voltage source Vref. The operational amplifier 706 comprises a non-inverting "+" terminal connected to the first input node n1 and an inverting terminal "−" connected to the second input node n2. The bipolar transistor Qa has a collector terminal connected to a first power supply node VCC, a base terminal connected to the first input node n1, and an emitter terminal connected to the resistor Ra. The bipolar transistor Qa is shown as an NPN device, although in an alternate embodiment of the invention, Qa is a PNP device. The MOS transistor M1a has a gate terminal connected to an output of the operational amplifier 706, a drain terminal connected to the resistor Ra, and a source terminal connected to a second voltage supply node VEE.

Furthermore, the second amplifier circuit 704 comprises an output node n3 and a reference node n4. The bipolar transistor Qb has a collector terminal connected to the first power supply node VCC, a base terminal connected to the reference node n4, and an emitter terminal connected to the resistor Rb. The bipolar transistor Qb is shown as an NPN device, although in an alternate embodiment of the invention, Qb is a PNP device. The MOS transistor M1b has a gate terminal connected to the output of the operational amplifier 706, a drain terminal connected to the resistor Rb, and a source terminal connected to the second voltage supply node VEE. Moreover, the MOS transistor M2a of the current mirror 708 is connected between the first supply voltage node VCC and the referenced node n4. The MOS transistor M2b of the current mirror 708 is connected between the first supply voltage node VCC and the output node n3. The MOS transistors M2a and M2b of the current mirror 708 are scaled at a ratio of 1:K.

In the embodiment of FIG. 7, the collector terminals are connected directly to the power supply node VCC without any load devices, as current-to-voltage conversion is not implemented (as in the embodiments of FIGS. 5 and 6) to generate output voltages that are compared to determine a detection event. Instead, the first amplifier 702 amplifies the input sensor current $I_{in}$ and the operational amplifier 706 drives both MOS transistors M1a and M1b to set up scaled versions of emitter currents in bipolar transistors Qa and Qb, which causes the second amplifier circuit 704 to output a current $I_{out}$ at node n3 which is a scaled version (current gain) of the input sensor current $I_{in}$, i.e., $I_{out}=I_{in}*M*K$.

The output current $I_{out}$ at node n3, and a programmable reference current $I_{REF}=I_{ref}*M*K$, are input to the current comparing circuitry 720. As in the embodiments discussed above, the current $I_{ref}$ is a reference sensor current level that represents a magnitude of the sensor current $I_{in}$ that would be indicative of a "detection event" (i.e., $I_{ref}$ is the magnitude of the sensor current $I_{in}$ that would be output from the sensor element when the read/write head is positioned at a predefined (gap) distance from the surface of the storage disk to perform a read or write operation). The current comparing circuitry 720 compares the referenced current $I_{REF}$ and the output current Iout to determine when Iout=$I_{REF}$, and generate an output control signal to indicate a detection event when Iout=$I_{REF}$. The current comparing circuitry 720 can be implemented using any conventional or state of the art architecture.

More specifically, the tunneling current sensor circuit 700 operates as follows. The operational amplifier 706, the MOS transistor M1a, and the bipolar transistor Qa form a feedback loop that reflects the reference voltage Vref onto the input node n1 as a bias voltage that is applied to the base terminal of bipolar transistor Qa and to the sensor element connected to the input node n1. The sensor current from the sensor is a function of the bias voltage on the input node n1 and the gap distance between the sensor element and the surface of the storage medium. In one embodiment of the invention, the reference voltage Vref is generated by a programmable voltage source to generate a desired reference voltage Vref which is used to set the bias voltage on the input node n1.

More specifically, the operational amplifier 706, the MOS transistor M1a, and the bipolar transistor Qa form a feedback loop that reflects the reference voltage Vref onto the input node n1 as a bias voltage that is applied to the base terminal of bipolar transistor Qa and to the sensor connected to the input node n1. The tunneling current output from the sensor is a function of the bias voltage on the input node n1 and the gap distance between the sensor needle and the disk plate. In one embodiment of the invention, the reference voltage Vref is generated by a programmable voltage source to generate a desired reference voltage Vref which is used to set the bias voltage on the input node n1.

In operation, the sensor current $I_{in}$ is input to the base terminal of the bipolar transistor Qa and the bipolar transistor Qa generates an emitter current equal to $I_{in}*(\beta+1)$. The feedback loop (formed by the bipolar transistor Qa, the MOS transistor M1a, and the operational amplifier 706) controls how much emitter current must be pulled through Qa to maintain the desired bias voltage on node n1, by causing the operational amplifier 706 to output a control voltage to the gate terminal of the MOS transistor M1a to drive the MOS transistor M1a (as a current source) to generate a current equal to the emitter current $I_{in}*(\beta+1)$ of the bipolar transistor Qa.

At the same time, the output voltage of the operational amplifier 706 drives the MOS transistor M1b (as a current source) in the second amplifier circuit 704 to cause an M-scaled version of the emitter current $I_{in}*(\beta+1)*M$ to flow out of the bipolar transistor Qb. In this regard, the input voltage control loop will simultaneously control emitter current in primary path through MOS transistor M1a and emitter current in the secondary path through MOS transistor M1b to generate scaled versions of emitter currents in bipolar transistors Qa and Qb In one embodiment shown in FIG. 7, the MOS transistors M1b and M1a are sized such that $[(W/L)_b]/[(W/L)_a]=M$. In this regard, the currents $I_{in}*M$ and $I_{in}*(\beta+1)*M$ at the base and emitter of bipolar transistor Qb are necessarily M times greater than the currents $I_{in}$ and $I_{in}*(\beta+1)$ at the base and emitter of bipolar transistor Qa. Therefore, the base current $I_{in}*M$ of the bipolar transistor Qb required to satisfy the emitter current $I_{in}*(\beta+1)*M$ of the bipolar transistor Qb is a matched and amplified version of the sensor current $I_{in}$ at the base of the bipolar transistor Qa.

Furthermore, the current $I_{in}*M$ at the base (n4) of the bipolar transistor Qb is further multiplied by a factor of K by the current mirror circuit 708. In one embodiment of the invention as shown in FIG. 7 where a simple current mirror is implemented using the matched MOS transistors M2a and M2b, this scaling can be achieved by setting the device ratio between MOS transistors M2a and M2b to be 1:K. Depending on the configuration of the current mirror circuit 708, the ratio K may be fixed or programmable. The current mirror circuit 708 generates an output current $I_{out}=I_{in}*M*K$, such that first and second amplifier circuits 702 and 704 provide a total current gain $I_{out}/I_{in}=M*K$.

With the embodiment of FIG. 7, any variation in the bipolar transistor devices Qa and Qb is removed from the current gain equation, as the current gain is a function of the ratios of various device sizes. Moreover, when comparing the signal level output from the node n3 to the threshold, the threshold can be generated as a fixed level. No secondary reference path is required to compensate the threshold for process variation of the primary path.

If the base voltages for Qa and Qb match, then the base currents will match. In an alternate embodiment of the invention, a feedback control circuit can be implemented to ensure that the base voltages of Qa and Qb remain the same. Indeed, the base voltage of bipolar transistor Qb is set by the voltage drop across the MOS transistor M2a from the supply voltage level VCC. A feedback loop circuit can be employed to sense the base voltages of Qa and Qb and adjust VCC so that the base voltage of Qb matches the base voltage of Qa.

The current mirror 708 shown in FIG. 7 comprises MOS transistors M2a and M2b in a standard current mirror configuration. In alternate embodiments of the invention, the current mirror 708 can be implemented using other current mirror architectures such as cascode, or Wilson, degenerated current mirror circuits, for example, to achieve better matching or better output impedance. In yet another alternate embodiment of the invention, the current mirror 708 is implemented using bipolar PNP devices instead of PMOS transistor devices M2a and M2b as shown in FIG. 7.

The MOS transistors M1a and M1b operate as simple current sources. In alternate embodiments of the invention, the current sources M1a and M1b can be replaced with other types of current sources such as cascade or source degenerated current sources. Moreover, in an alternate embodiment of the invention, the MOS transistors M1a and M1b can be replaced with bipolar NPN transistors.

Furthermore, the resistors Ra and Rb are implemented in FIG. 7 to limit a maximum current through the respective current paths occupied by the resistors Ra and Rb. Depending on the implementation, the resistors Ra and Rb may or may not be necessary, and excluding these resistors does not change the application. In an alternate embodiment of the invention, the resistors Ra and Rb can be connected to the base terminals of bipolar transistors Qa and Qb to limit the amount of base current.

Figure 8:
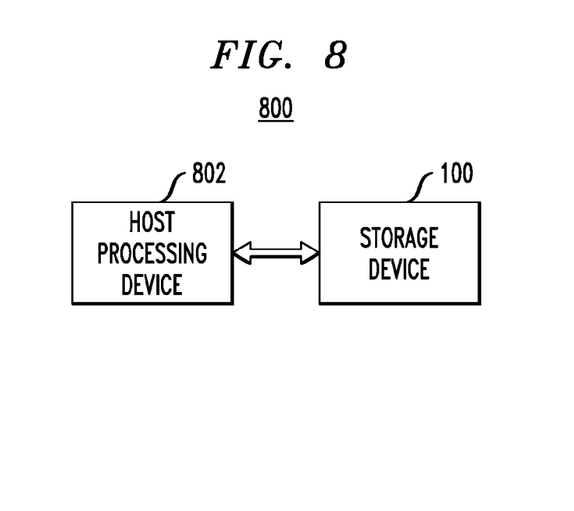
FIG. 8 illustrates interconnection of the storage device of FIG. 1 with a host processing device in a data processing system.

FIG. 8 illustrates a processing system 800 comprising the disk-based storage device 100 connected to a host processing device 802, which may be a computer, server, communication device, etc. Although shown as a separate element in this figure, the storage device 100 may be incorporated into the host processing device. Instructions such as read commands and write commands directed to the storage device 100 may originate from the processing device 802, which may comprise processor and memory elements similar to those previously described in conjunction with FIG. 3.

Figure 9:
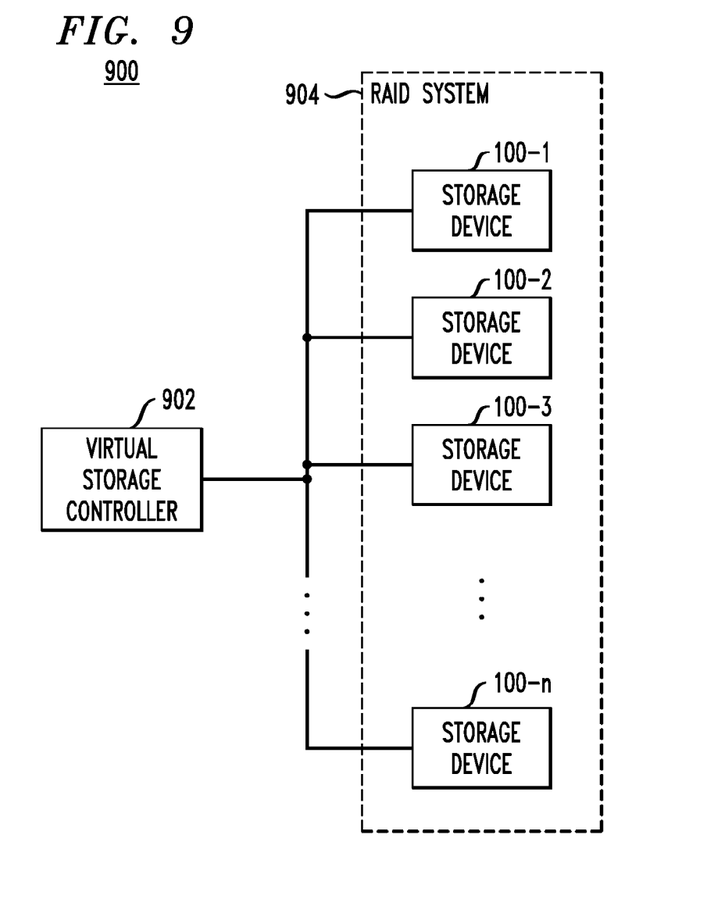
FIG. 9 shows a virtual storage system incorporating a plurality of disk-based storage devices of the type shown in FIG. 1.

Multiple disk-based storage devices 100 may be incorporated into a virtual storage system 900 as illustrated in FIG. 9. The virtual storage system 900, also referred to as a storage virtualization system, illustratively comprises a virtual storage controller 902 coupled to a RAID system 904, where RAID denotes Redundant Array of Independent Disks. The RAID system more specifically comprises N distinct storage devices denoted 100-1, 100-2, . . . , 100-N, one or more of which are assumed to be configured to include embodiments of tunneling current sensor circuitry as disclosed herein. These and other virtual storage systems comprising hard disk drives or other disk-based storage devices of the type disclosed herein are considered embodiments of the invention. The host processing device 802 in FIG. 8 may also be an element of a virtual storage system, and may incorporate the virtual storage controller 902.

It is to be understood that while the embodiments of FIGS. 5, 6 and 7 describe tunneling current sensor circuits in the context of storage device applications, the amplifier architectures shown in the embodiments of FIGS. 5, 6 and 7 can be implemented in current sensor circuits for other embodiments where, for example, it is necessary to detect small currents with high sensitivity. For example, in one embodiment of the invention, a sensor element (or detector element) can be a photodiode that is connected to a current sensor circuit having an architecture that is similar to any of the embodiments shown in FIG. 5, 6 or 7. In such an embodiment, the current sensor circuit would be employed to detect a relatively small current that is generated by the photodiode in response to photon exposure. It is to be understood that amplifier architectures according to embodiments of the invention as described herein can be used to detect small sensor currents on the order of pico-amperes, as well as larger currents. In this regard, although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. An amplifier circuit, comprising;
a first input node to receive an input current, a second input node to receive an input reference voltage, and an output node;
a first supply voltage node and a second supply voltage node;
a load device connected between the output node and the first supply voltage node;
an operational amplifier having a first input terminal connected to the first input node, a second input terminal connected to the second input node, and an output terminal;
a current source connected to the output terminal of the operational amplifier and to the second supply voltage node; and
a bipolar transistor having a base terminal connected to the first input node, a collector terminal connected to the output node, and an emitter terminal connected to the current source,
wherein the operational amplifier, the current source, and the bipolar transistor form a feedback loop that generates and maintains a bias voltage on the first input node based on the input reference voltage applied to the second input node,
wherein the bipolar transistor amplifies the input current that is input to the base terminal and generates a collector current as the amplified input current, and
wherein the load device converts the collector current of the bipolar transistor to an output voltage on the output node.

2. The amplifier circuit of claim 1, wherein the load device comprises a diode-connected field effect transistor.

3. The amplifier circuit of claim 1, wherein the load device comprises a resistor.

4. The amplifier circuit of claim 1, wherein the current source comprises a field effect transistor having a gate terminal connected to the output terminal of the operational amplifier.

5. The amplifier circuit of claim 1, further comprising a resistor connected between the emitter terminal of the bipolar transistor and the current source.

6. The amplifier circuit of claim 1, further comprising a programmable reference voltage source connected to the second input node of the amplifier circuit to generate the input reference voltage.

7. The amplifier circuit of claim 1, further comprising a sensor element connected to the first input node of the amplifier circuit to generate a sensor current which is input to the base terminal of the bipolar transistor.

8. The amplifier circuit of claim 7, wherein the sensor element is an element on a read/write head of a storage device.

9. The amplifier circuit of claim 1, further comprising a comparing circuit connected to the output node of the amplifier circuit, wherein the comparing circuit compares the output voltage with an output reference voltage to detect when the input current is at a predetermined level.

10. The amplifier circuit of claim 1, wherein the amplifier circuit is fabricated as part of an integrated circuit.

11. An amplifier circuit, comprising:
a first input node to receive an input current, a second input node to receive a reference voltage, and an output node;
a first supply voltage node and a second supply voltage node;
a first amplifier circuit comprising:
an operational amplifier having a first input terminal connected to the first input node, a second input terminal connected to the second input node, and an output terminal;
a first current source connected to the output terminal of the operational amplifier and to the second supply voltage node; and
a first bipolar transistor having a base terminal connected to the first input node, a collector terminal connected to the first supply voltage node, and an emitter terminal connected to the first current source; and
a second amplifier circuit comprising:
a second current source connected to the output terminal of the operational amplifier and to the second supply voltage node;
a second bipolar transistor having a base terminal, a collector terminal connected to the first supply voltage node, and an emitter terminal connected to the first current source; and
a current mirror circuit connected to the base terminal of the second bipolar transistor, the first supply voltage node, and the output node.

12. The amplifier circuit of claim 11, wherein the operational amplifier, the first current source, and the first bipolar transistor form a feedback loop that generates and maintains a bias voltage on the first input node based on the reference voltage applied to the second input node.

13. The amplifier circuit of claim 11, wherein the first and second current sources are first and second field effect transistors that are matched and scaled by M, wherein the operational amplifier outputs a control voltage to drive gate terminals of the first and second field effect transistors to generate a first emitter current that flows from the first bipolar transistor and generate a second emitter current that flows from the second bipolar transistor, wherein the second emitter current is an M-scaled version of the first emitter current.

14. The amplifier circuit of claim 13, wherein the second bipolar transistor generates a base current which is an M-scaled version of an input current at the base terminal of the first bipolar transistor, and wherein the current mirror generates a K-scaled version of the base current of the second bipolar transistor and outputs an output current from the output node of the amplifier circuit, wherein the output current is a K*M scaled version of the input current at the base terminal of the first bipolar transistor.

15. The amplifier circuit of claim 14, further comprising a current comparing circuit connected to the output node of the amplifier circuit, wherein the current comparing circuit compares the output current with a reference current to detect when the input current at the base terminal of the first bipolar transistor is at a predetermined level.

16. The amplifier circuit of claim 11, further comprising a sensor element connected to the first input node of the amplifier circuit to generate a sensor current which is input to the base terminal of the first bipolar transistor.

17. The amplifier circuit of claim 16, wherein the sensor element is an element on a read/write head of a storage device.

18. The amplifier circuit of claim 11, further comprising:
a first resistor connected between the emitter terminal of the first bipolar transistor and the first current source; and
a second resistor connected between the emitter terminal of the second bipolar transistor and the second current source.

19. The amplifier circuit of claim 11, further comprising a programmable reference voltage source connected to the second input node of the amplifier circuit to generate the reference voltage.

20. The amplifier circuit of claim 11, wherein the amplifier circuit is fabricated as part of an integrated circuit.

21. A storage system, comprising:
a storage medium;
a read/write head to read and write data to and from the storage medium, wherein the read/write head comprises a sensor element to generate a sensor current as the read/write head approaches a surface of the storage medium; and
current sensor circuitry to process the sensor current generated by the sensor element to detect when the read/write head is positioned at a predefined distance from the surface of the storage medium based on a predetermined level of the sensor current, wherein the current sensor circuitry comprises:
an amplifier circuit, comprising:
a first input node to receive the sensor current, a second input node to receive an input reference voltage, and a first output node;
a first supply voltage node and a second supply voltage node;
a first load device connected between the first output node and the first supply voltage node;
a first operational amplifier having a first input terminal connected to the first input node, a second input terminal connected to the second input node, and an output terminal;
a first current source connected to an output terminal of the first operational amplifier and to the second supply voltage node; and
a first bipolar transistor having a base terminal connected to the first input node, a collector terminal connected to the first output node, and an emitter terminal connected to the first current source,
wherein the first operational amplifier, the first current source, and the first bipolar transistor form a feedback loop that generates and maintains a bias voltage on the first input node based on the input reference voltage applied to the second input node,
wherein the first bipolar transistor amplifies the sensor current that is input to the base terminal of the first bipolar transistor and generates a collector current as the amplified sensor current, and
wherein the first load device converts the collector current of the first bipolar transistor to an output voltage on the first output node; and a voltage comparing circuit connected to the first output node of the amplifier circuit, wherein the voltage comparing circuit compares the output voltage with an output reference voltage to detect when the sensor current is at the predetermined level, wherein the voltage comparing circuit generates a control signal when the sensor current is detected to be at the predetermined level.

22. The storage system of claim 21, further comprising a reference circuit to generate the output reference voltage, wherein the amplifier circuit and the reference circuit have one or more matching components that are scaled by a factor of M such that the output voltage and output reference voltage are a function of a device size ratio of matching components in the amplifier circuit and the reference circuit.

23. The storage system of claim 22, wherein the reference circuit comprises:
   a reference node;
   a second output node;
   a second operational amplifier matched to the first operational amplifier;
   a second current source matched to the first current source;
   a second bipolar transistor matched to the first bipolar transistor;
   a second load device matched to the first load device, and
   a reference current source that generates a reference current to the reference node.

24. The storage system of claim 23, wherein the second bipolar transistor has a base terminal connected to the reference node to receive the reference current output from the reference current source, a collector terminal connected to the second output node, and an emitter terminal,
   wherein the second load device is connected between the second output node and the first voltage supply node;
   wherein the second current source is connected between the emitter terminal of the second bipolar transistor and the second voltage supply node;
   wherein the second operational amplifier has a first input terminal connected to the reference node, a second input terminal connected to the second input node, and an output terminal connected to the second current source;
   wherein the second operational amplifier, the second current source, and the second bipolar transistor form a feedback loop that generates and maintains a same bias voltage on the reference node, which is on the first input node, based on the reference voltage applied to the second input node,
   wherein the second bipolar transistor amplifies the reference current that is input to the base terminal of the second bipolar transistor to generate a collector current as the amplified reference current, and
   wherein the second load device converts the collector current of the second bipolar transistor to an output reference voltage on the second output node.

25. The storage system of claim 24, wherein the first and second load devices are matched diode-connected field effect transistor devices that are scaled at a 1:M ratio.

26. The storage system of claim 24, wherein the first and second load devices are resistors having respective resistance values that are scaled at a 1:1/M ratio.

27. The storage system of claim 24, wherein the reference current is a M-scaled version of the predetermined level of the sensor current.

28. The storage system of claim 24, further comprising a first resistor connected between the emitter terminal of the first bipolar transistor and the first current source, and a second resistor connected between the emitter terminal of the second bipolar transistor and the second current source.

29. A virtual storage system comprising the storage system of claim 21.

30. A storage system, comprising:
   a storage medium;
   a read/write head to read and write data to and from the storage medium, wherein the read/write head comprises a sensor element to generate a sensor current as the read/write head approaches a surface of the storage medium; and
   current sensor circuitry to process the sensor current generated by the sensor element to detect when the read/write head is positioned at a predefined distance from the surface of the storage medium based on a predetermined level of the sensor current, wherein the current sensor circuitry comprises:
   an amplifier circuit, comprising:
      a first input node to receive the sensor current, a second input node to receive a reference voltage, and an output node;
      a first supply voltage node and a second supply voltage node;
      a first amplifier circuit; and
      a second amplifier circuit,
      wherein the first amplifier circuit comprises:
         an operational amplifier having a first input terminal connected to the first input node, a second input terminal connected to the second input node, and an output terminal;
         a first current source connected to the output terminal of the operational amplifier and to the second supply voltage node; and
         a first bipolar transistor having a base terminal connected to the first input node, a collector terminal connected to the first supply voltage node, and an emitter terminal connected to the first current source; and
      wherein the second amplifier circuit comprises:
         a second current source connected to the output terminal of the operational amplifier and to the second supply voltage node;
         a second bipolar transistor having a base terminal, a collector terminal connected to the first supply voltage node, and an emitter terminal connected to the first current source; and
         a current mirror circuit connected to the base terminal of the second bipolar transistor, the first supply voltage node, and the output node; and
   a current comparing circuit connected to the output node of the amplifier circuit, wherein the current comparing circuit compares a current output from the output node of the amplifier circuit with a reference current to detect when the sensor current is at the predetermined level, wherein the current comparing circuit generates a control signal when the sensor current is detected to be at the predetermined level.

31. The storage system of claim 30, wherein the operational amplifier, the first current source, and the first bipolar transistor form a feedback loop that generates and maintains a bias voltage on the first input node based on the reference voltage applied to the second input node.

32. The storage system of claim 30, wherein the first and second current sources are first and second field effect transistors that are matched and scaled by M, wherein the operational amplifier outputs a control voltage to drive gate terminals of the first and second field effect transistors to generate a first emitter current that flows from the first bipolar transistor and generate a second emitter current that flows from the second bipolar transistor, wherein the second emitter current is an M-scaled version of the first emitter current.

33. The storage system of claim 32, wherein the second bipolar transistor generates a base current which is an M-scaled version of the sensor current at the base terminal of the first bipolar transistor, and wherein the current mirror generates a K-scaled version of the base current of the second bipolar transistor and outputs an output current from the output node of the amplifier circuit, wherein the output current is a K*M scaled version of the sensor current input to the base terminal of the first bipolar transistor.

34. A virtual storage system comprising the storage system of claim 30.

* * * * *

UNITED STATES PATENT AND TRADEMARK OFFICE
CERTIFICATE OF CORRECTION

PATENT NO. : 8,760,790 B2
APPLICATION NO. : 13/674308
DATED : June 24, 2014
INVENTOR(S) : Natzke et al.

It is certified that error appears in the above-identified patent and that said Letters Patent is hereby corrected as shown below:

In the Specification

Column 4, line 9, after "manner" please insert --.--

Column 7, line 12, please delete "$R^f$" and insert --$R_f$--

Column 7, line 34, please delete "increases $I_{sense}$" and insert --$I_{sense}$ increases--

Column 11, line 16, please delete "500" and insert --600--

Column 11, line 20, before "of FIG. 5" please delete "604" and insert --504--

Column 11, line 31, after "$V_{out}=$" please delete "*"

Signed and Sealed this
Twenty-sixth Day of August, 2014

Michelle K. Lee
*Deputy Director of the United States Patent and Trademark Office*